United States Patent
Noda et al.

(10) Patent No.: US 8,885,082 B2
(45) Date of Patent: Nov. 11, 2014

(54) SOLID-STATE IMAGE SENSOR AND CAMERA

(71) Applicant: Canon Kabushiki Kaisha, Tokyo (JP)

(72) Inventors: Tomoyuki Noda, Kawasaki (JP); Koichiro Iwata, Kawasaki (JP); Takeshi Akiyama, Kawasaki (JP); Taro Kato, Kawasaki (JP); Yoichi Wada, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 63 days.

(21) Appl. No.: 13/644,773

(22) Filed: Oct. 4, 2012

(65) Prior Publication Data

US 2013/0100322 A1    Apr. 25, 2013

(30) Foreign Application Priority Data

Oct. 20, 2011   (JP) ................. 2011-231093

(51) Int. Cl.
*H04N 3/14*       (2006.01)
*H04N 5/335*      (2011.01)
*H01L 27/146*     (2006.01)
*H01L 31/0232*    (2014.01)
*H04N 5/3745*     (2011.01)

(52) U.S. Cl.
CPC .......... *H01L 27/146* (2013.01); *H04N 5/37457* (2013.01); *H01L 27/14641* (2013.01); *H01L 27/14603* (2013.01); *H04N 5/335* (2013.01); *H01L 31/0232* (2013.01)
USPC ........... 348/294; 348/298; 348/300; 348/302; 348/312

(58) Field of Classification Search
USPC ......... 348/294–324; 250/208.1; 257/290–292
See application file for complete search history.

(56) References Cited

U.S. PATENT DOCUMENTS

| | | | |
|---|---|---|---|
| 7,382,011 B2 | 6/2008 | Noda et al. |
| 7,518,096 B2 | 4/2009 | Noda |
| 7,561,199 B2 | 7/2009 | Noda et al. |
| 7,679,117 B2 | 3/2010 | Noda et al. |
| 7,741,593 B2 | 6/2010 | Iwata et al. |
| 7,787,037 B2 | 8/2010 | Ono et al. |
| 7,825,974 B2 | 11/2010 | Itano et al. |
| 7,985,947 B2 | 7/2011 | Noda |
| 8,013,369 B2 | 9/2011 | Iwata et al. |
| 8,063,967 B2 | 11/2011 | Itano et al. |
| 8,081,245 B2 | 12/2011 | Itano et al. |
| 8,159,577 B2 | 4/2012 | Iwata et al. |

(Continued)

FOREIGN PATENT DOCUMENTS

| | | |
|---|---|---|
| JP | 2005-109411 A | 4/2005 |
| JP | 2008-042238 A | 2/2008 |

*Primary Examiner* — Yogesh Aggarwal
(74) *Attorney, Agent, or Firm* — Fitzpatrick, Cella, Harper & Scinto

(57) ABSTRACT

A solid-state image sensor has a plurality of pixel units, each pixel unit including a plurality of pixels, and a charge-voltage converter shared by the plurality of pixels. The sensor includes a structural portion including a plurality of wiring layers, an interlayer insulating film, and light waveguides configured by embedding, in portions of the interlayer insulating film located above the photoelectric converters, a material having a refractive index higher than that of the interlayer insulating film. A dummy pattern is formed in the structural portion to reduce a difference between a sensitivity of a first pixel and that of a second pixel, which is produced by a difference between a structure in a periphery of the light waveguide arranged above the photoelectric converter of the first pixel and that of the second pixel.

20 Claims, 13 Drawing Sheets

(56) References Cited

U.S. PATENT DOCUMENTS

| | | |
|---|---|---|
| 8,212,905 B2 | 7/2012 | Noda et al. |
| 8,259,205 B2 | 9/2012 | Noda et al. |
| 8,305,473 B2 | 11/2012 | Takenaka et al. |
| 8,355,066 B2 | 1/2013 | Iwata et al. |
| 8,363,137 B2 | 1/2013 | Sonoda et al. |
| 8,368,790 B2 | 2/2013 | Itano et al. |
| 2005/0072906 A1 | 4/2005 | Dobashi ............... 250/208.1 |
| 2008/0030612 A1 | 2/2008 | Itano et al. .............. 348/340 |
| 2010/0201856 A1 | 8/2010 | Hayashi et al. |
| 2010/0230583 A1* | 9/2010 | Nakata et al. ........... 250/227.2 |
| 2011/0199521 A1 | 8/2011 | Kato et al. |
| 2011/0272750 A1 | 11/2011 | Iwata et al. |
| 2012/0033116 A1 | 2/2012 | Kato |

* cited by examiner

PU

F I G. 3
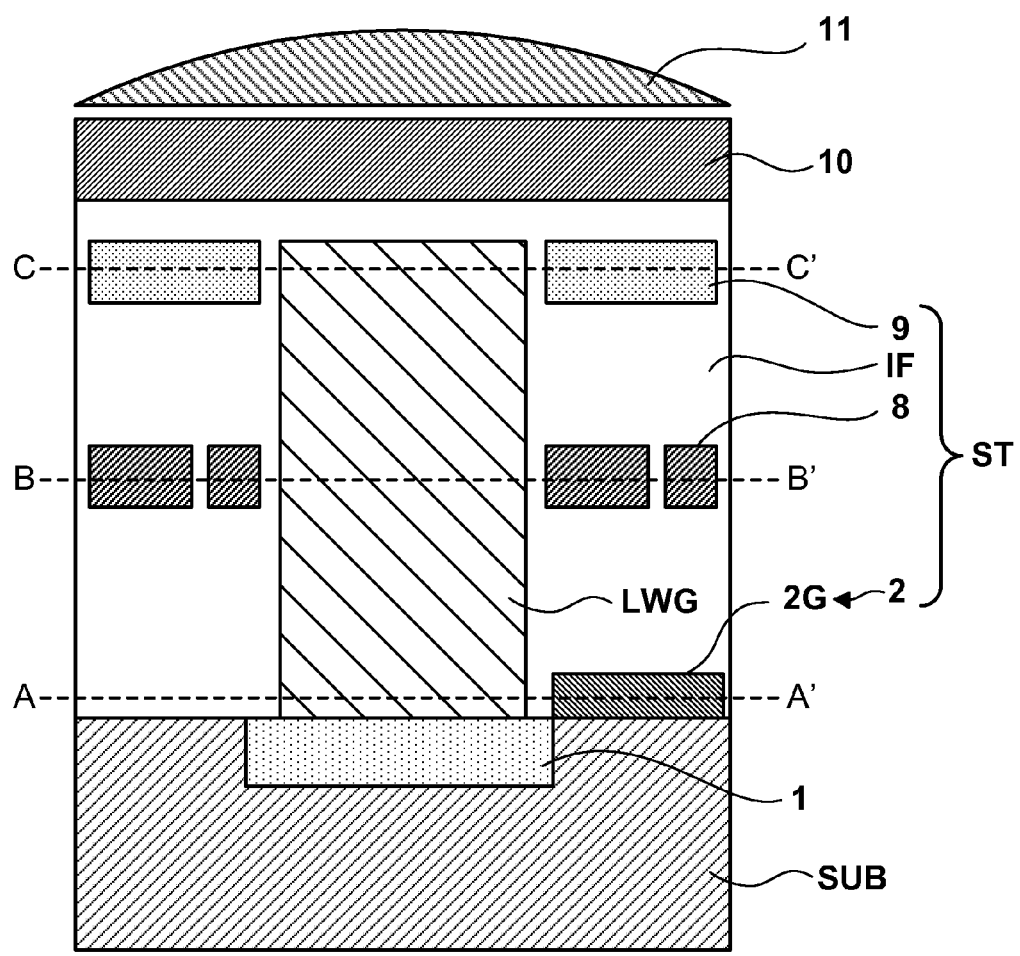

F I G. 6
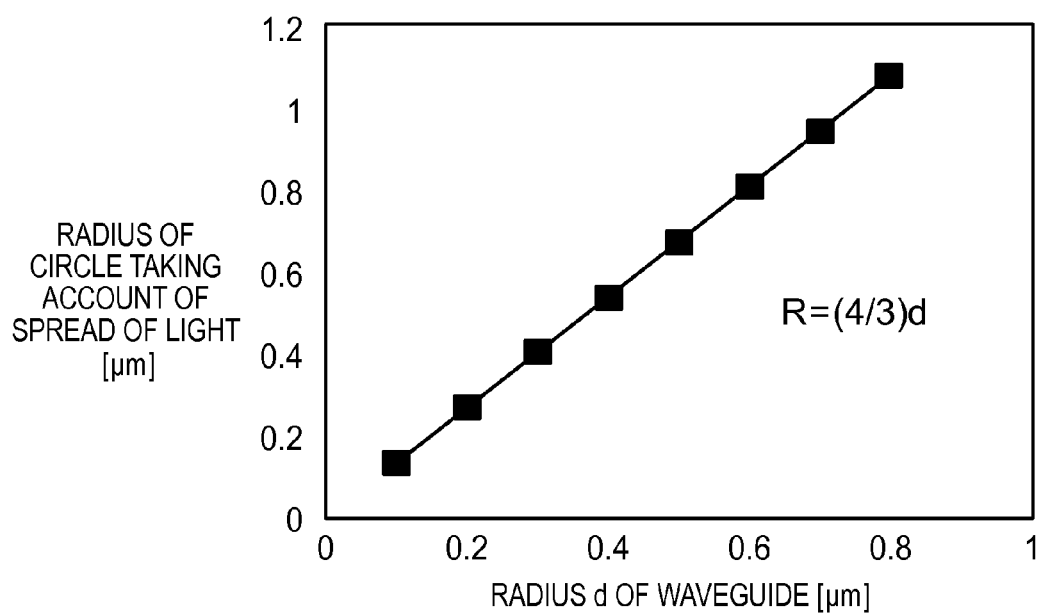

F I G. 11
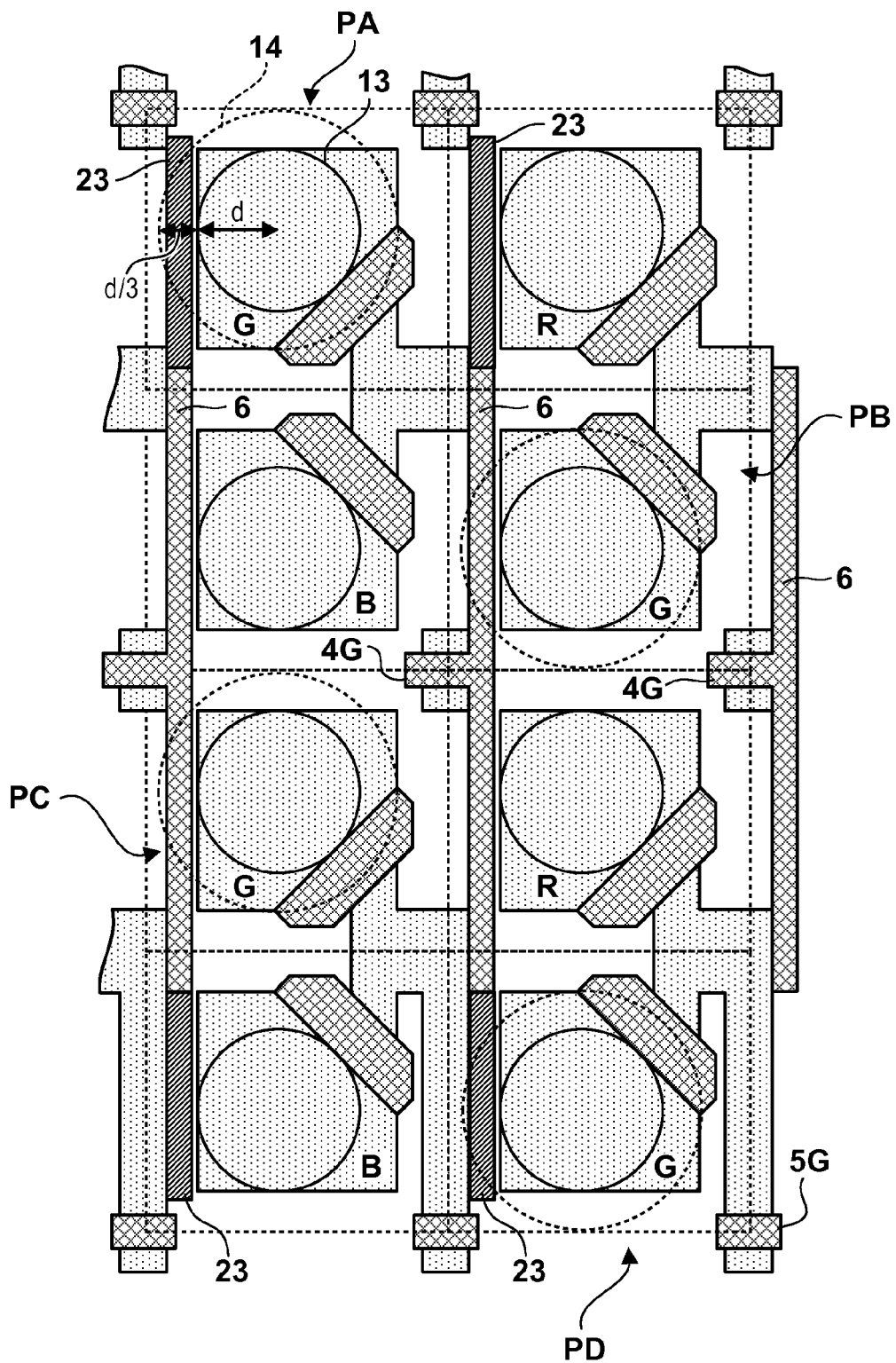

SOLID-STATE IMAGE SENSOR AND CAMERA

BACKGROUND OF THE INVENTION

1. Field of the Invention

The present invention relates to a solid-state image sensor and a camera including the same.

2. Description of the Related Art

As the number of pixels of a solid-state image sensor increases, the size of the pixel decreases, and the area of a photoelectric converter decreases accordingly. Generally, the sensitivity of a pixel decreases as the area of a photoelectric converter decreases. Japanese Patent Laid-Open No. 2008-042238 has disclosed a technique that increases the sensitivity by causing a plurality of pixels to share a transistor and floating diffusion, thereby decreasing the ratio of the area occupied by these components, and suppressing the reduction in area of a photoelectric converter.

Japanese Patent Laid-Open No. 2005-109411 has disclosed a structure that reduces the decrease in sensitivity caused by the reduction in area of a photoelectric converter. This structure is called a light waveguide, and can be formed by forming a hole in a planarization film above a photoelectric converter, and filling a high-refractive-index material in the hole.

Generally, a spatially localized electromagnetic wave has the property of spreading by diffraction. The light waveguide propagates light by returning light that travels away from the optical axis toward the optical axis by reflection and refraction, and thus confines it inside the waveguide along the optical axis. Therefore, the light waveguide can efficiently guide light incident on its upper portion to a photoelectric converter. However, the light incident on the upper portion of the light waveguide is not entirely guided to the photoelectric converter, and some light leaks out of the light waveguide.

In a solid-state image sensor in which a plurality of pixels share a floating diffusion, the structures of the pixels sharing the floating diffusion can be different from each other. Assume that a first pixel has a polysilicon pattern outside a light waveguide, and a second pixel has no polysilicon pattern outside the light waveguide. In this case, in the first pixel, light leaking out of the light waveguide may be incident on the polysilicon pattern and reflected or refracted. In the second pixel, however, no such phenomenon caused by the polysilicon pattern occurs. This produces a sensitivity difference between the first and second pixels. A sensitivity difference like this may produce fixed pattern noise in an image.

SUMMARY OF THE INVENTION

The present invention provides a technique advantageous in reducing a sensitivity difference.

One of the aspects of the present invention provides a solid-state image sensor comprising a plurality of pixel units, wherein each pixel unit comprises a plurality of pixels, and a charge-voltage converter shared by the plurality of pixels, each pixel including a photoelectric converter formed in a semiconductor substrate, the sensor comprises, on the semiconductor substrate, a structural portion including a plurality of wiring layers, an interlayer insulating film, and light waveguides configured by embedding, in portions of the interlayer insulating film which are located above the photoelectric converters, a material having a refractive index higher than that of the interlayer insulating film, the plurality of pixels in each pixel unit include a first pixel and a second pixel, and a dummy pattern is formed in the structural portion to reduce a difference between a sensitivity of the first pixel and a sensitivity of the second pixel, which is produced by a difference between a structure in a periphery of the light waveguide arranged above the photoelectric converter of the first pixel and a structure in a periphery of the light waveguide arranged above the photoelectric converter of the second pixel.

Further features of the present invention will become apparent from the following description of exemplary embodiments with reference to the attached drawings.

BRIEF DESCRIPTION OF THE DRAWINGS

FIG. 3 is an exemplary sectional view showing the structure of a light waveguide;

FIG. 6 is a view showing the spread of light guided by the light waveguide;

FIG. 11 is a view showing the layout of a solid-state image sensor including the pixel unit shown in FIG. 9;

DESCRIPTION OF THE EMBODIMENTS

A solid-state image sensor of the first embodiment of the present invention will be explained below with reference to FIGS. 1 to 8. The solid-state image sensor of the first embodiment includes a plurality of pixel units PU, and the plurality of pixel units PU are typically arranged to configure a plurality of rows and a plurality of columns. Each pixel unit includes a plurality of pixels and a charge-voltage converter shared by the plurality of pixels, and each pixel includes a photoelectric converter formed on a semiconductor substrate. A charge-voltage converter CVC of each pixel unit PU can include a plurality of floating diffusions physically isolated from each other. In this case, the plurality of floating diffusions are electrically connected to each other, thereby forming one charge-voltage converter CVC. A plurality of pixels of each of the plurality of pixel units PU can be arranged to configure a plurality of rows and a plurality of columns.

Figure 1:
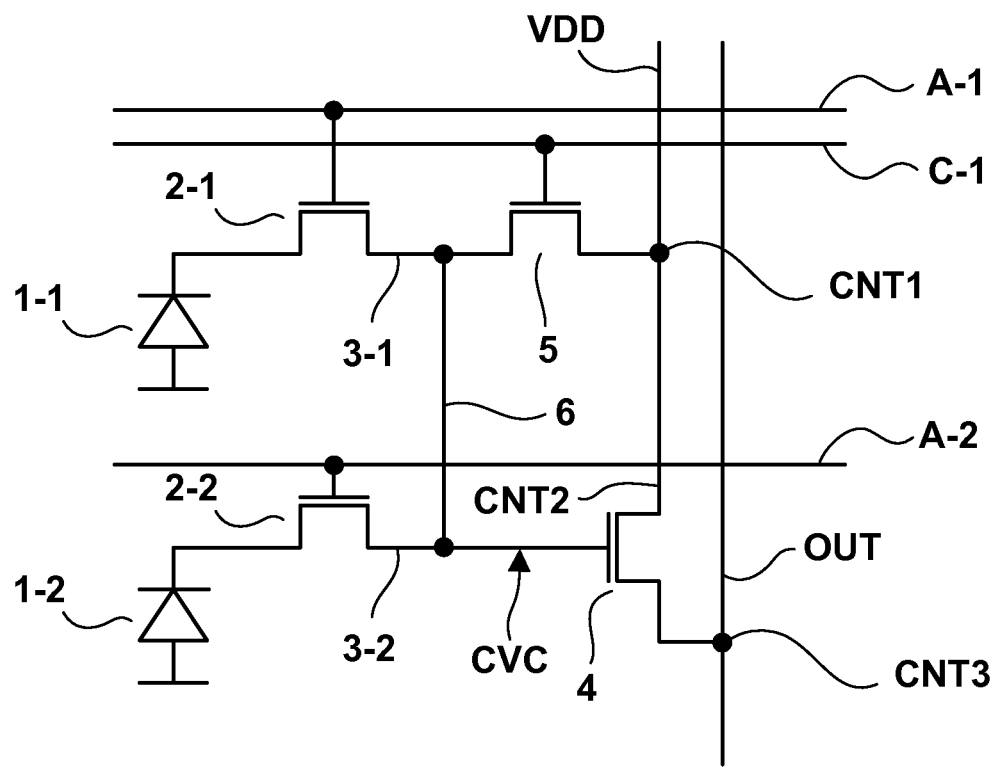
FIG. 1 is an equivalent circuit diagram of a pixel unit in which two pixels share a charge-voltage converter.

In an example shown in FIG. 1, each pixel unit PU includes two photoelectric converters 1-1 and 1-2 as a plurality of photoelectric converters. In addition, each pixel unit PU can include transfer transistors 2-1 and 2-2, an amplifier transistor 4, and a reset transistor 5. When transfer control signals supplied through transfer control lines A-1 and A-2 are at active level, the transfer transistors 2-1 and 2-2 respectively transfer charge generated by the photoelectric converters 1-1 and 1-2 to the common charge-voltage converter CVC. The charge-voltage converter CVC can include a diffusion region 3-1 of the transfer transistor 2-1 and a diffusion region 3-2 of the transfer transistor 2-2. The diffusion regions of the transfer transistors 2-1 and 2-2 can be formed by a common continuous diffusion region. Alternatively, the diffusion region 3-1 of the transfer transistor 2-1 and the diffusion region 3-2 of the transfer transistor 2-2 can be spaced apart from each other, and can electrically be connected to each other by a conductive connecting pattern 6.

The potential of the charge-voltage converter CVC changes in accordance with the amount of charges transferred to the charge-voltage converter CVC. The amplifier transistor 4 outputs a signal corresponding to the potential of the charge-voltage converter CVC to an output signal line OUT. Typically, the output signal line OUT can be a column signal line in a pixel array formed by pixels arranged to configure a plurality of rows and a plurality of columns. One diffusion region of the amplifier transistor 4 is connected to a power supply line VDD via a contact CNT2, and the other diffusion region is connected to the output signal line OUT via a contact CNT3. The reset transistor 5 resets the potential of the charge-voltage converter CVC when a reset signal supplied through a reset signal line C-1 is at active level. One diffusion region of the reset transistor 5 is connected to the charge-voltage converter CVC, and the other diffusion region is connected to the power supply line VDD via a contact CNT1.

Figure 2:
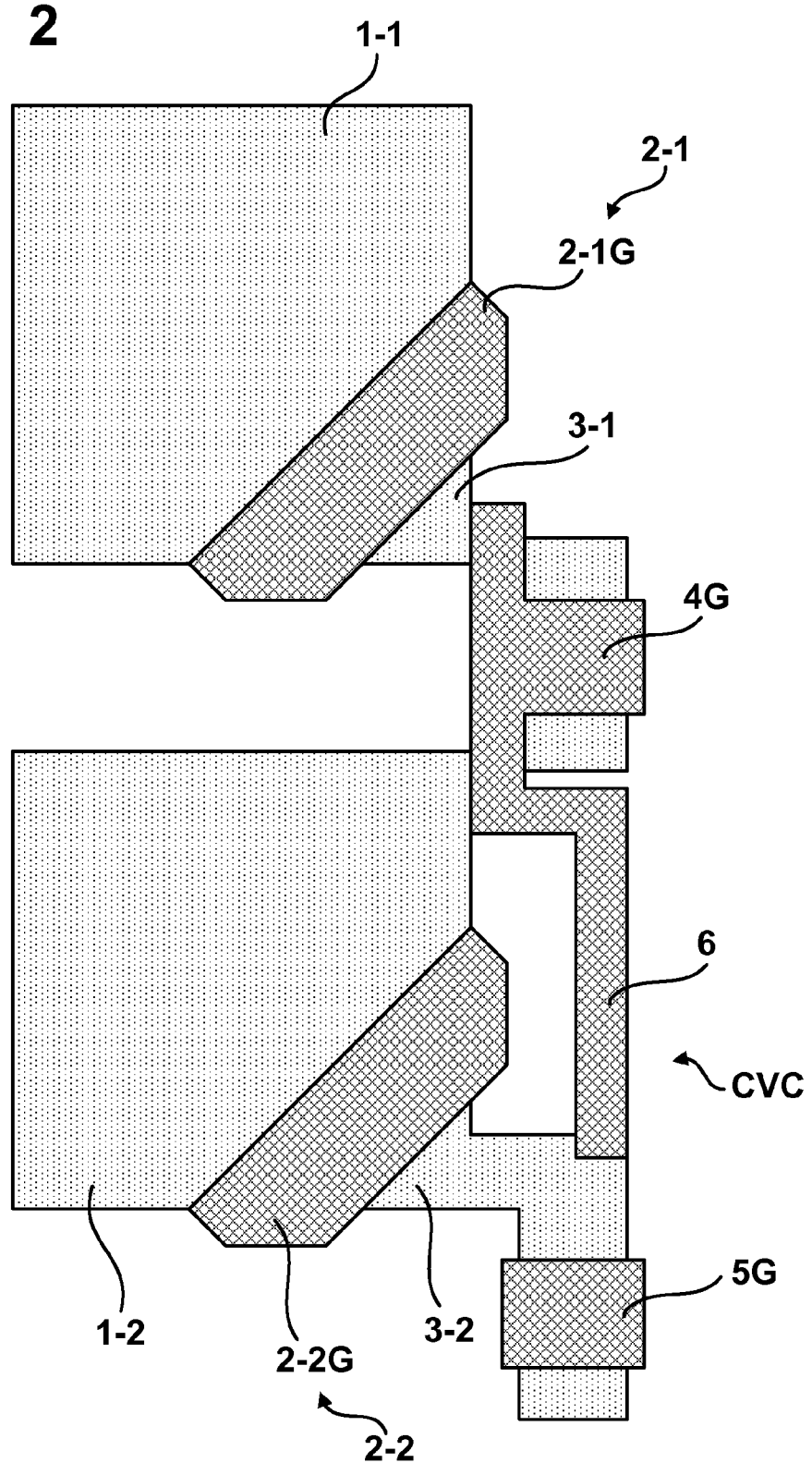
FIG. 2 is a view showing the layout of the pixel unit shown in FIG. 1.

FIG. 2 shows an example of the layout design of the pixel unit PU shown in FIG. 1. FIG. 2 omits wiring layers above a gate electrode layer. A gate electrode 4G of the amplifier transistor 4, a gate electrode 5G of the reset transistor 5, and gate electrodes 2-1G and 2-2G of the transfer transistors 2-1 and 2-2 are arranged in the gate electrode layer. In the example shown in FIG. 2, the diffusion layer 3-1 of the transfer transistor 2-1 and the diffusion layer 3-2 of the transfer transistor 2-2 are electrically connected by the conductive connecting pattern 6 such as a silicide pattern.

FIG. 3 is an exemplary view showing the structure of a light waveguide of one pixel in the pixel unit PU shown in FIG. 1. FIG. 3 shows a photoelectric converter 1 representing the photoelectric converters 1-1 and 1-2, and a gate electrode 2G representing the gate electrodes 2-1G and 2-2G of the transfer transistors 2-1 and 2-2. The gate electrode 2G is formed in a gate electrode layer as a wiring layer 2. The photoelectric converter 1 is formed in a semiconductor substrate SUB. The solid-state image sensor includes a structural portion ST on the semiconductor substrate SUB. The structural portion ST includes a plurality of wiring layers 2, 8, and 9, an interlayer insulating film IF, and a light waveguide LWG formed by embedding, in the interlayer insulating film IF above each photoelectric converter 1, a material having a refractive index higher than that of the interlayer insulating film IF. The wiring layer 2 is a gate electrode layer and typically made of polysilicon or a silicide. The wiring layers 8 and 9 are typically made of a metal.

Figure 4:
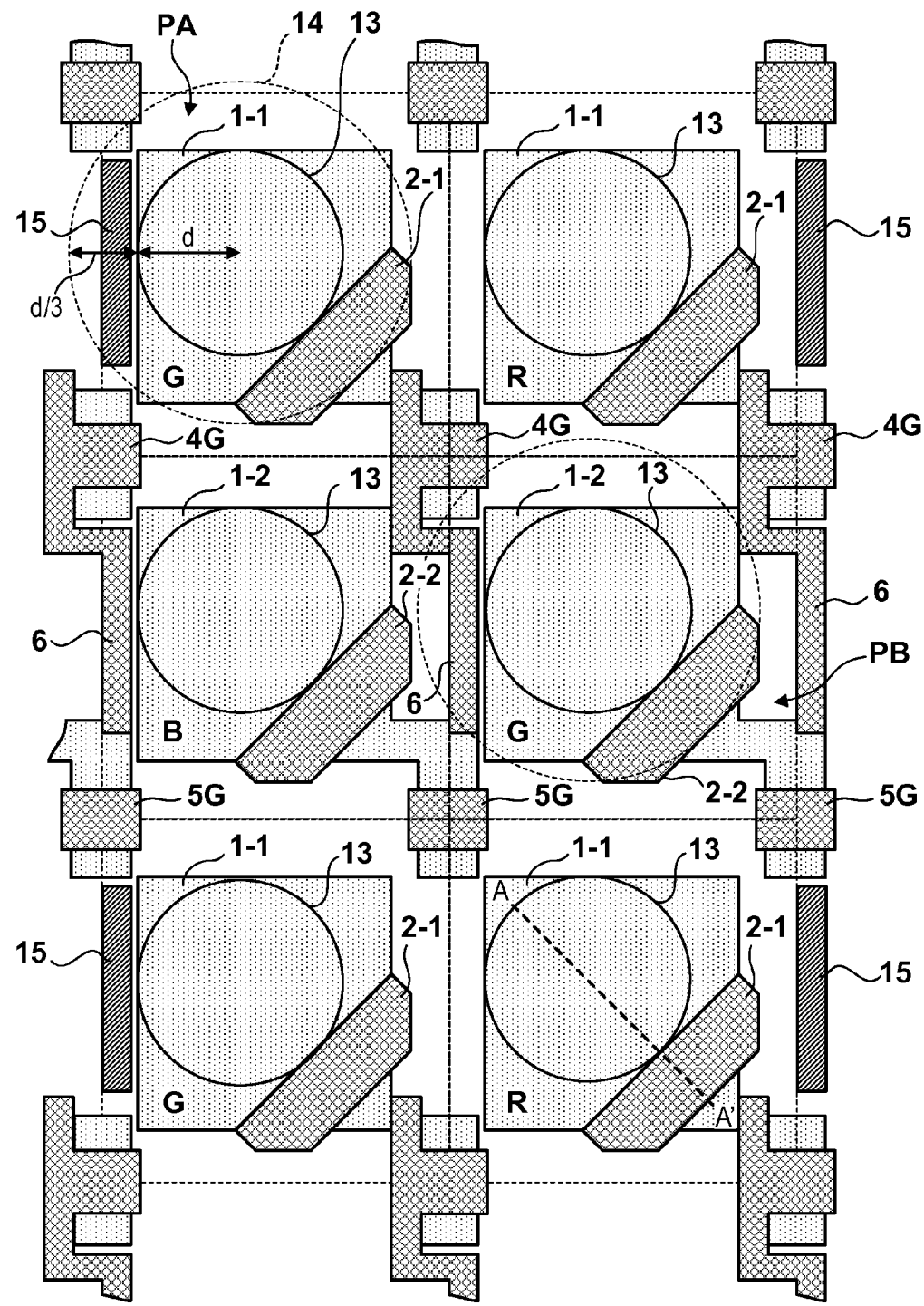
FIG. 4 is a view showing the layout of a solid-state image sensor including the pixel unit shown in FIG. 1.

FIG. 4 shows an example of the layout design of a solid-state image sensor including the pixel unit shown in FIG. 1. A solid line 13 indicates a light waveguide in a section (A-A' in FIG. 3) cut parallel to the photoelectric converter 1 and at the same height as that of the wiring layer 2. "R", "G", and "B" indicate the colors (red, green, and blue) of color filters allocated to pixels when applying a color filter array complying with the Bayer array. A first pixel PA and second pixel PB are examples of two pixels to which color filters of the same color are allocated. A dotted line 14 indicates a light leak range assumed in the first pixel PA and second pixel PB. The structural portion ST includes dummy patterns 15. The dummy patterns 15 can be arranged between adjacent light waveguides LWG. Similar to the gate electrodes 4G and 5G and connecting patterns 6, the dummy patterns 15 are patterns formed in the gate electrode layer as the wiring layer 2. For example, when the gate electrodes 4G and 5G and connecting patterns 6 are made of polysilicon, the dummy patterns 15 can also be made of polysilicon. The dummy patterns 15 can be given a fixed potential or float.

Assume that no dummy patterns 15 exist. In this case, a difference between the structure in a periphery of the light waveguide LWG arranged above the photoelectric converter 1-1 of the first pixel PA and the structure in a periphery of the light waveguide LWG arranged above the photoelectric converter 1-2 of the second pixel PB produces a difference between the sensitivity of the first pixel PA and that of the second pixel PB. In the example shown in FIG. 4, the connecting pattern 6 exists on the left side of the second pixel PB, but no connecting pattern 6 exists on the left side of the first pixel PA. In the second pixel PB, therefore, the connecting pattern 6 on the left side reflects or refracts light leaking from the light waveguide LWG (denoted by reference numeral 13 in FIG. 4) of the second pixel PB. This reflection or refraction has influence on light incident on the photoelectric converter 1-2 of the second pixel PB. On the other hand, the first pixel PA undergoes no such influence. This produces the difference between the sensitivity of the first pixel PA and that of the second pixel PB. The dummy pattern 15 makes the influence the structure in a periphery of the light waveguide LWG of the first pixel PA has on the sensitivity of the first pixel PA close to the influence the structure in a periphery of the light waveguide LWG of the second pixel PB has on the sensitivity of the second pixel PB, thereby reducing the sensitivity difference between the first pixel PA and second pixel PB. The dummy pattern 15 can also be formed by extending the gate electrode (for example, the gate electrode 4) in a periphery of the dummy pattern 15.

The dummy pattern 15 is formed so that the structures of the first pixel PA and second pixel PB become closer to similar shapes, or a structure mirror-symmetrical to the structure of the first pixel PA and the structure of the second pixel PB become closer to similar shapes.

The range of light leaking outside from the light waveguide LWG, that is, the distribution of a formed optical electric field can be obtained by solving the following wave equations.

(Inside Waveguide)

$$\frac{\partial^2 E_y}{\partial^2 x} + (k_0^2 \cdot n_1^2 - \beta^2)E_y = 0 \qquad (1)$$

Figure 5A:
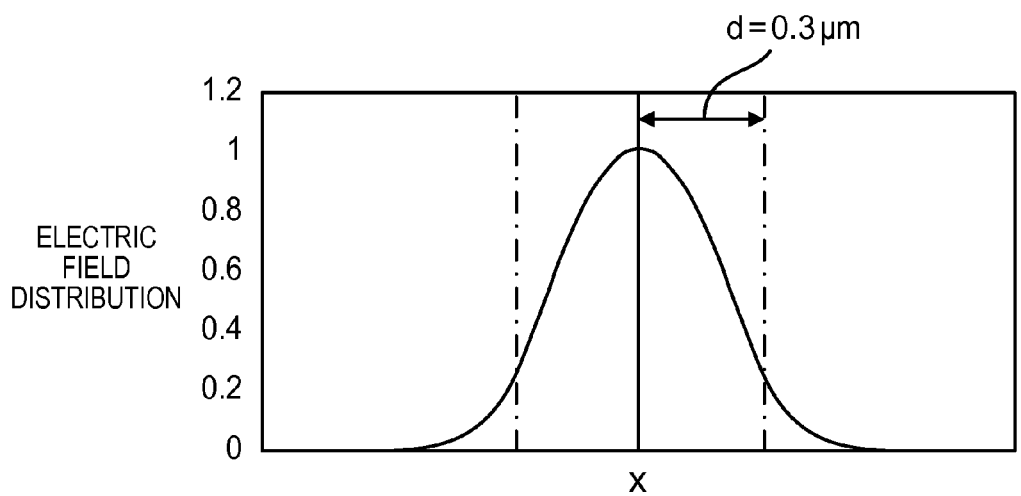
FIGS. 5A and 5B are views showing the spreading (optical electric field distribution) characteristics of light guided by the light waveguide.
Figure 5B:
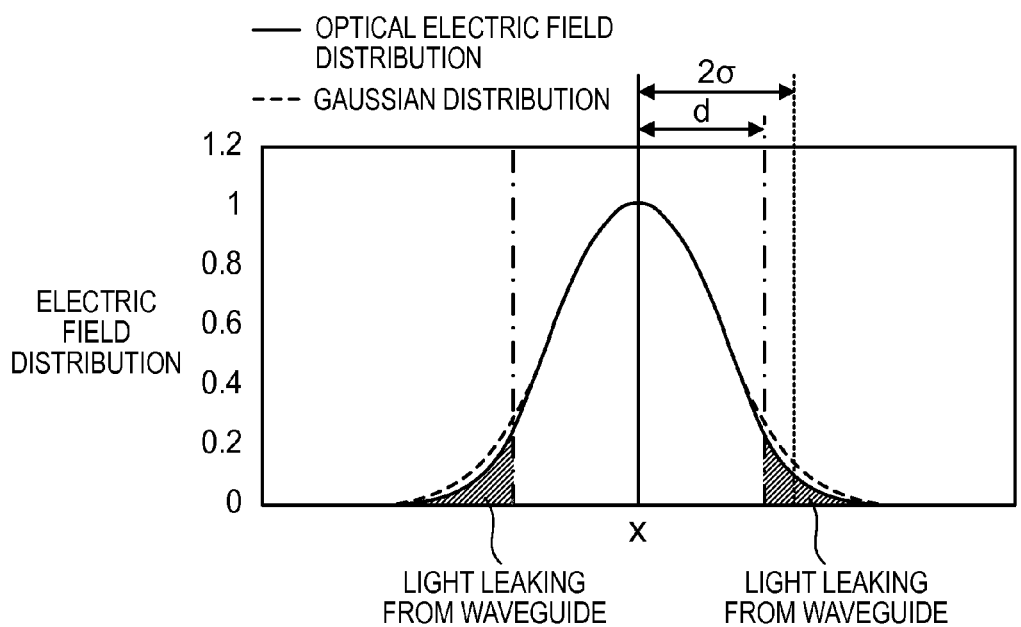

(Outside Waveguide)

$$\frac{\partial^2 E_y}{\partial^2 x} + (\beta^2 - k_0^2 \cdot n_2^2)E_y = 0 \qquad (2)$$

where Ey is the longitudinal electric field inside the light waveguide, $n_1$ is the refractive index inside the light waveguide, $n_2$ is the refractive index outside the light waveguide, $k_0$ is a propagation coefficient in a vacuum, and $\beta$ is a propagation coefficient inside the light waveguide. General solutions of the wave equations can be approximated by a sine function or cosine function inside the light waveguide, and can be approximated by an exponential function outside the light waveguide. When the wave equations are solved for the radius (d=0.3 μm) of a given light waveguide by assuming that the boundary condition is continuous inside and outside the light waveguide, $n_1$=1.6 to 2.1, and $n_2$=1.43 (SiO), the optical electric field distribution of the light waveguide is as shown in FIG. 5A. When a Gaussian distribution having the same standard deviation σ as that of this optical electric field distribution is superposed on it, the result is as shown in FIG. 5B. Fixed pattern noise becomes conspicuous when a sensitivity difference of about 7% is produced. In the Gaussian distribution, the range of 2σ contains about 95%. Therefore, in an optical electric field in which an external distribution of 2σ is smaller than the Gaussian distribution, a circle having a radius of 2σ need only be considered as a light leak range. A relationship as shown in FIG. 6 is obtained when equations (1) and (2) are solved for the radius d of 0.1 to 0.8 μm of the light waveguide, the radius d of the light waveguide is plotted on the abscissa, and 2σ twice the standard deviation σ of the optical electric field distribution is plotted on the ordinate. When this relationship is linearly approximated, the approximation straight line is represented by $$R=(4/3)d \quad (3)$$

As the range within which light leaks outside the light waveguide LWG, it is only necessary to take account of a virtual column that has a radius of (4/3)d where d is the radius of the light waveguide LWG, and is concentric with the light waveguide LWG. Note that solutions when the radius d of the light waveguide is 0.8 μm or less are plotted in FIG. 6, but the characteristic is the same even when the radius is more than 0.8 μm.

From the foregoing, letting d be the radius of the light waveguide LWG, the dummy pattern 15 is preferably a pattern including a portion arranged in a virtual column that has a radius of (4/3)d and is concentric with the light waveguide LWG.

Figure 7:
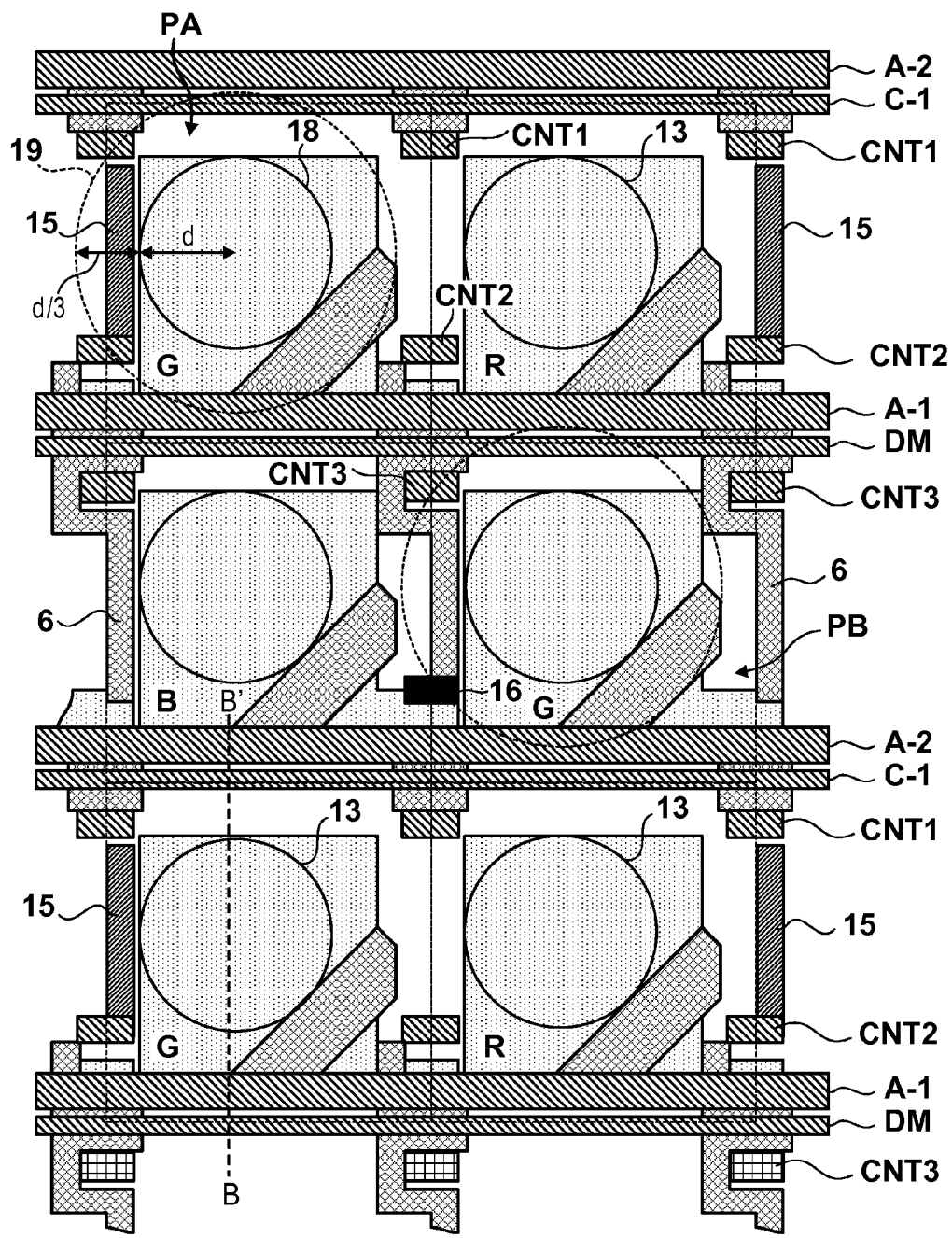
FIG. 7 is a view showing the layout of a solid-state image sensor including the pixel unit shown in FIG. 1.

FIG. 7 shows an example of the layout design of a solid-state image sensor including the pixel unit shown in FIG. 1. This layout design example shown in FIG. 7 can be adopted together with the layout design example shown in FIG. 4, and can also be adopted singly. Transfer control lines A-1 and A-2, a reset signal line C-1, contacts CNT1, CNT2, and CNT3, and dummy patterns DM and 16 are patterns in a wiring layer 8 (see FIG. 3). The wiring layer 8 is a first metal wiring layer. Note that the contacts CNT1, CNT2, and CNT3 further include plugs for connecting diffusion layers and the wiring layer 8. A solid line 18 indicates a light waveguide in a section (B-B' in FIG. 3) cut parallel to the wiring layer 8 and at the same height as that of the wiring layer 8. A dotted line 14 indicates a light leak range assumed in the first pixel PA and second pixel PB. This range is calculated by equation (3).

The dummy patterns DM and 16 are formed so that the structures of the first pixel PA and second pixel PB become closer to similar shapes, or a structure mirror-symmetrical to the structure of the first pixel PA and the structure of the second pixel PB become closer to similar shapes.

Figure 8:
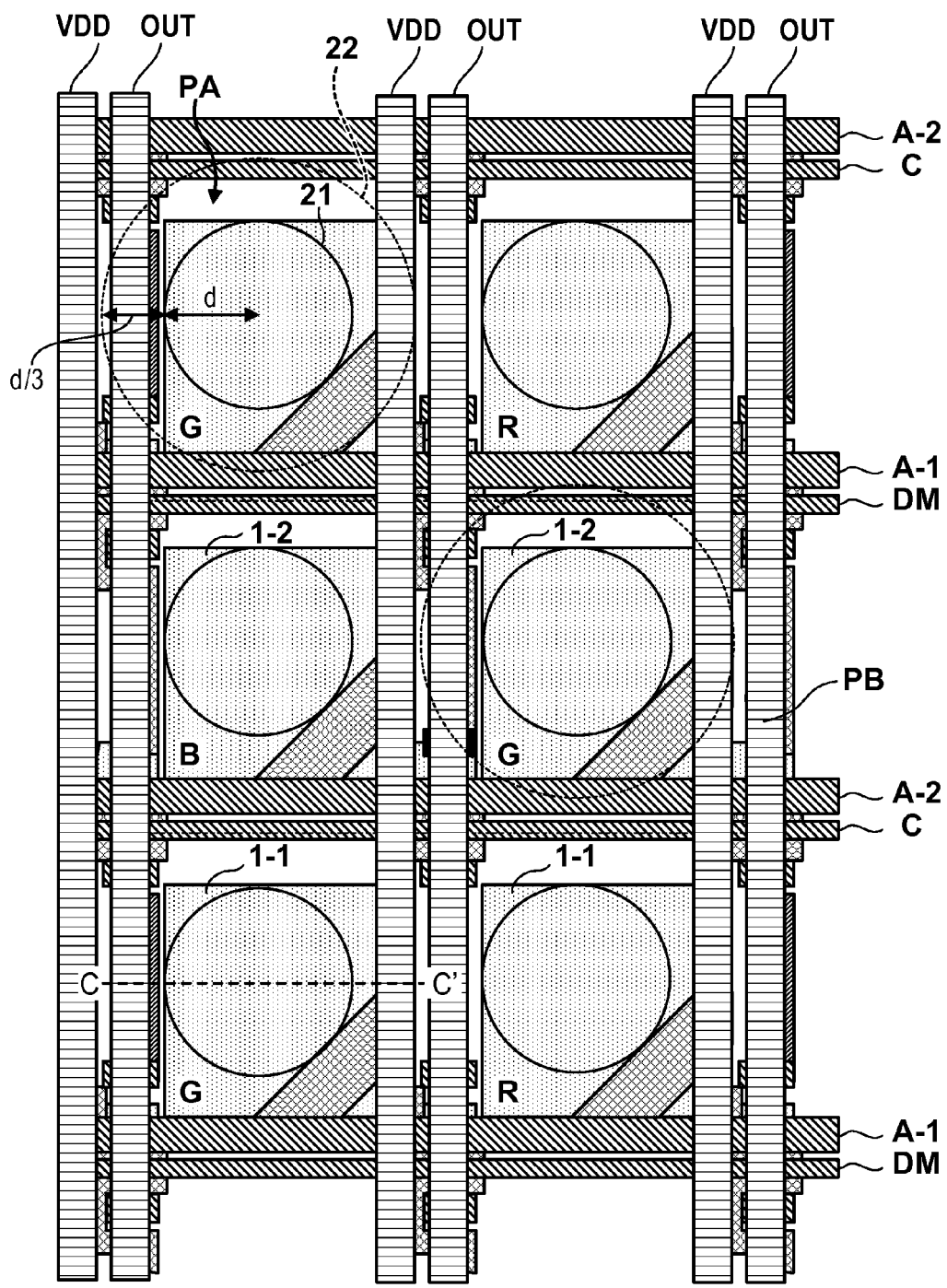
FIG. 8 is a view showing the layout of a solid-state image sensor including the pixel unit shown in FIG. 1.

FIG. 8 shows an example of the layout design of a solid-state image sensor including the pixel unit shown in FIG. 1. This layout design example shown in FIG. 8 can be adopted together with the layout design example shown in FIG. 4 and/or the layout design example shown in FIG. 7, and can also be adopted singly. A power supply line VDD and output signal line OUT are patterns formed in a wiring layer 9 (see FIG. 3). The wiring layer 9 is a second metal wiring layer. A solid line 21 indicates a light waveguide in a section (C-C' in FIG. 3) cut parallel to the wiring layer 9 and at the same height as that of the wiring layer 9. A dotted line 22 indicates a light leak range assumed in the first pixel PA and second pixel PB. This range is calculated by equation (3).

The power supply line VDD and output signal line OUT are formed so that the structures of the first pixel PA and second pixel PB become closer to similar shapes, or a structure mirror-symmetrical to the structure of the first pixel PA and the structure of the second pixel PB become closer to similar shapes.

A solid-state image sensor of the second embodiment of the present invention will be explained below with reference to FIGS. 9 to 13. Note that items not explained in the second embodiment can follow those of the first embodiment. In the second embodiment shown in FIG. 9, each pixel unit PU includes four photoelectric converters 1-1, 1-2, 1-3, and 1-4 as a plurality of photoelectric converters. Each pixel unit PU can also include transfer transistors 2-1, 2-2, 2-3, and 2-4, an amplifier transistor 4, and a reset transistor 5. When transfer control signals supplied through transfer control lines A-1 to A-4 are at active level, the transfer transistors 2-1 to 2-4 transfer charge generated by the photoelectric converters 1-1 and 1-4 to a common charge-voltage converter CVC. The charge-voltage converter CVC can include a diffusion region 3-1 of the transfer transistor 2-1, a diffusion region 3-2 of the transfer transistor 2-2 a diffusion region 3-3 of the transfer transistor 2-3, and a diffusion region 3-4 of the transfer transistor 2-4. The transfer transistors 2-1, 2-2, 2-3, and 2-4 can be formed by a common continuous diffusion region. Alternatively, all or some of the transfer transistors 2-1, 2-2, 2-3, and 2-4 can be spaced apart from each other and electrically be connected to each other by a conductive connecting pattern 6.

Figure 9:
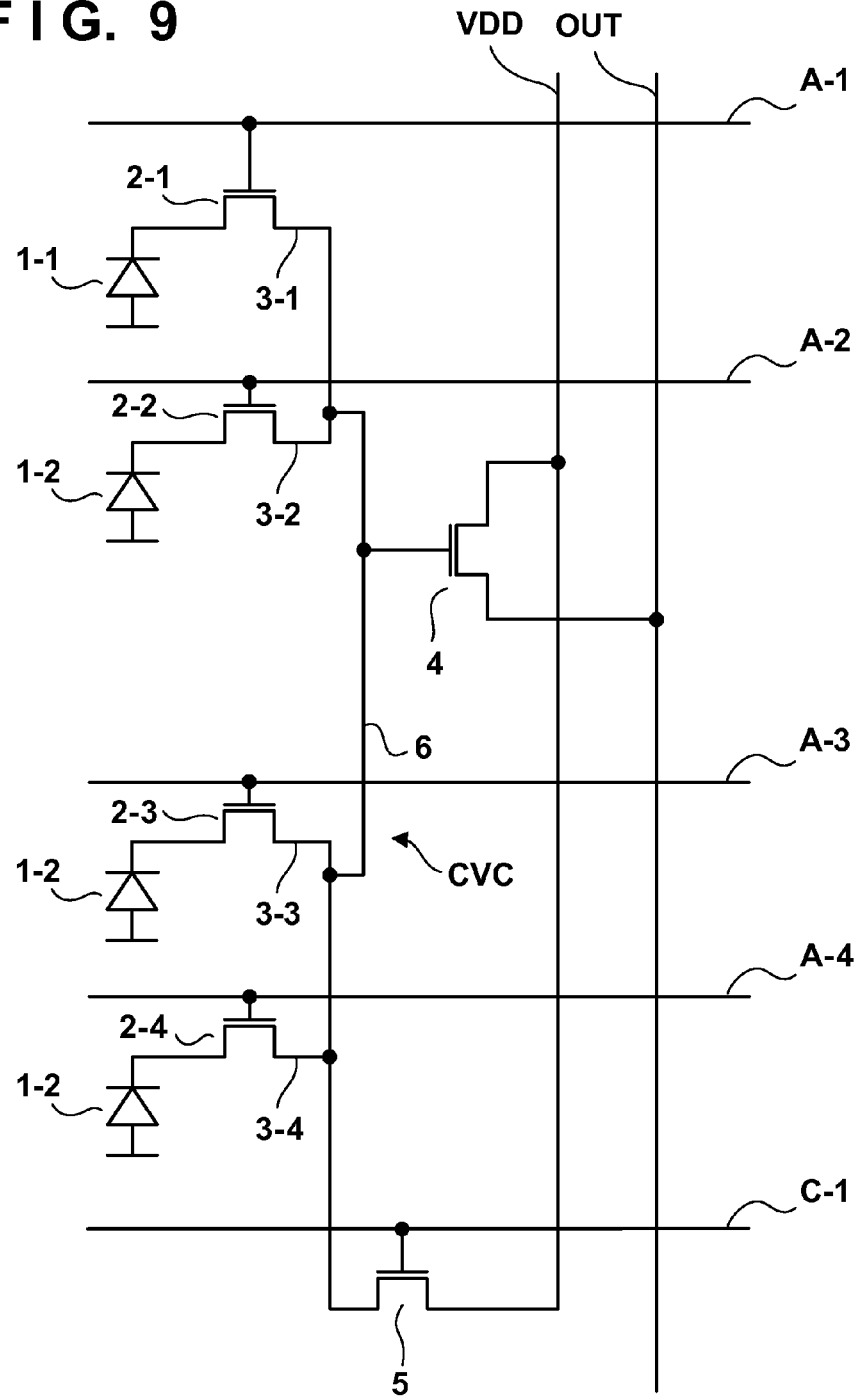
FIG. 9 is a view showing an equivalent circuit of a pixel unit in which four pixels share a charge-voltage converter.
Figure 10:
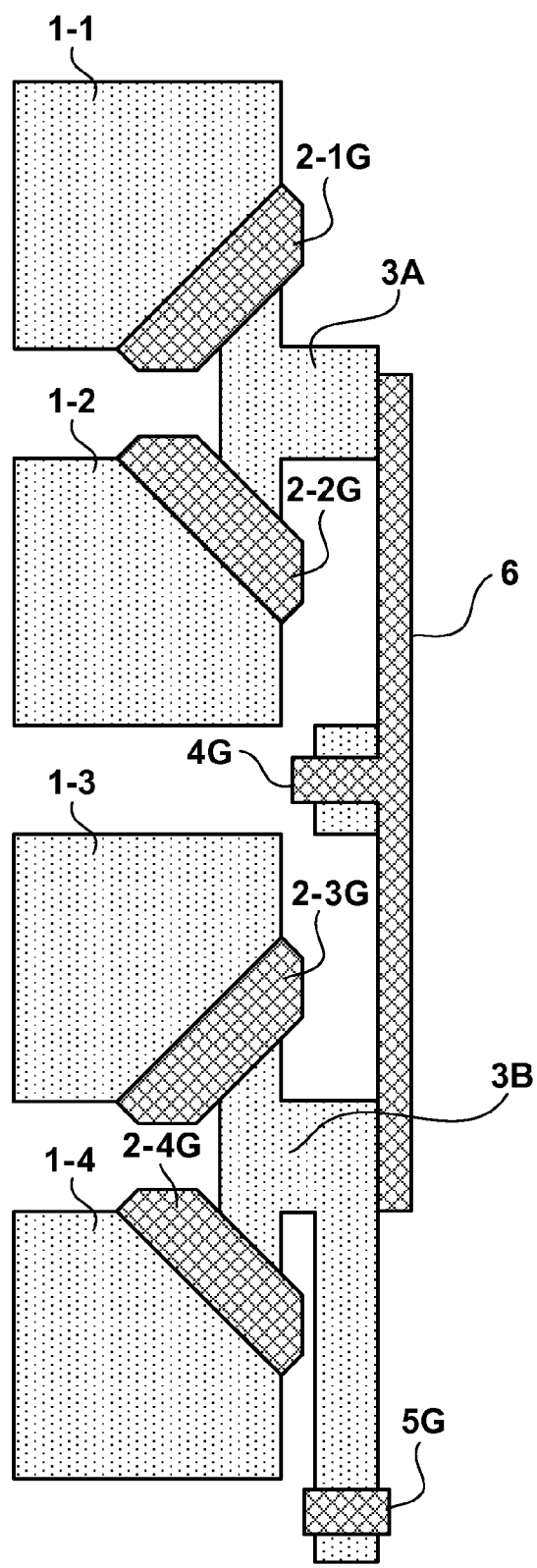
FIG. 10 is a view showing the layout of the pixel unit shown in FIG. 9.

FIG. 10 shows an example of the layout design of the pixel unit PU shown in FIG. 9. FIG. 10 omits wiring layers above a gate electrode layer. A gate electrode 4G of the amplifier transistor 4, a gate electrode 5G of the reset transistor 5, and gate electrodes 2-1G, 2-2G, 2-3G, and 2-4G of the transfer transistors 2-1, 2-2, 2-3, and 2-4 are arranged in the gate electrode layer. In the example shown in FIG. 10, the diffusion layers 3-1 and 3-2 of the transfer transistors 2-1 and 2-2 are formed by a common diffusion layer 3A, and the diffusion layers 3-3 and 3-4 of the transfer transistors 2-3 and 2-4 are formed by a common diffusion layer 3B. The diffusion layers 3A and 3B are connected by the conductive connecting pattern 6 such as a polysilicon pattern.

FIG. 11 shows an example of the layout design of a solid-state image sensor including the pixel unit shown in FIG. 9. A solid line 13 indicates a light waveguide in a section (A-A' in FIG. 3) cut parallel to a photoelectric converter 1 and at the same height as that of a wiring layer 2. "R", "G", and "B" indicate the colors of color filters allocated to pixels when applying a color filter array complying with the Bayer array. A first pixel PA, second pixel PB, third pixel PC, and fourth pixel PD are, "R", "G", and "B" indicate the colors of color filters allocated to pixels when applying a color filter array complying with the Bayer array. A dotted line 14 indicates a light leak range assumed in the first pixel PA, second pixel PB, third pixel PC, and fourth pixel PD. This range is calculated by equation (3).

For the first pixel PA and fourth pixel PD, dummy patterns 23 are formed in structural portions ST. Similar to the gate electrodes 4G and 5G and connecting patterns 6, the dummy patterns 23 are patterns formed in the gate electrode layer as the wiring layer 2. For example, when the gate electrodes 4G and 5G and connecting patterns 6 are made of polysilicon, the dummy patterns 23 can also be made of polysilicon. The dummy patterns 23 can be given a fixed potential or float.

The dummy patterns 23 can be formed so that the structures of the first pixel PA, second pixel PB, third pixel PC, and fourth pixel PD become closer to similar shapes. Alternatively, the dummy patterns 23 can be formed so that a structure mirror-symmetrical to one of the first pixel PA, second pixel PB, third pixel PC, and fourth pixel PD and the structures of other pixels become closer to similar shapes. As in the first embodiment, letting d be the radius of the light waveguide LWG, the dummy pattern 23 is preferably a pattern including a portion arranged in a virtual column that has a radius of (4/3)d and is concentric with the light waveguide LWG.

Figure 12:
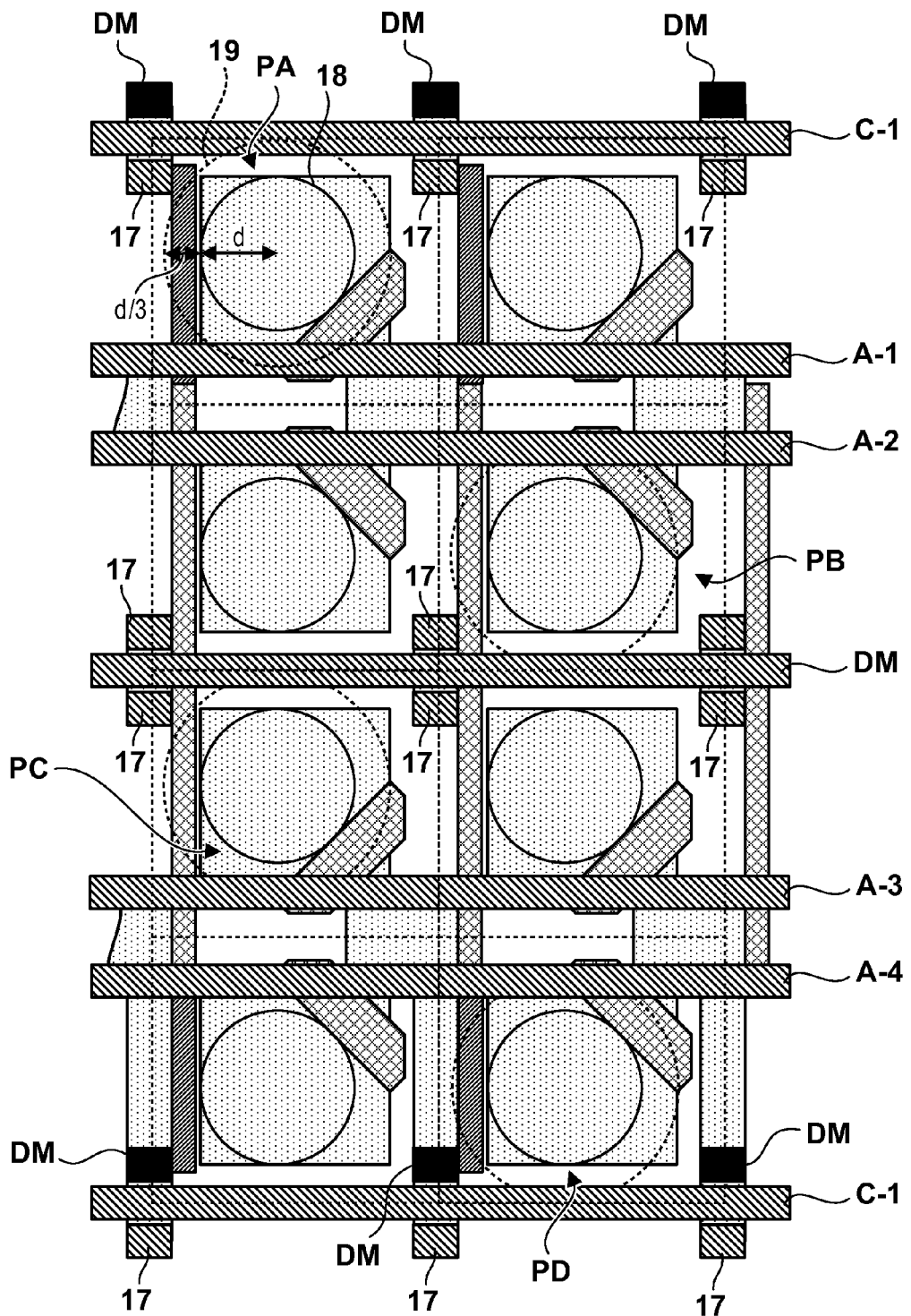
FIG. 12 is a view showing the layout of a solid-state image sensor including the pixel unit shown in FIG. 9.

FIG. 12 shows an example of the layout design of a solid-state image sensor including the pixel unit shown in FIG. 9. This layout design example shown in FIG. 12 can be adopted together with the layout design example shown in FIG. 11, and can also be adopted singly. Transfer control lines A-1, A-2, A-3, and A-4, reset signal lines C-1, contacts 17, and dummy patterns DM are patterns formed in a wiring layer 8 (see FIG. 3). The wiring layer 8 is a first metal wiring layer. Note that the contacts 17 further include plugs for connecting diffusion layers and the wiring layer 8. A solid line 18 indicates a light waveguide in a section (B-B' in FIG. 3) cut parallel to the wiring layer 8 and at the same height as that of the wiring layer 8. A dotted line 19 indicates a light leak range assumed in the first pixel PA and second pixel PB. This range is calculated by equation (3).

The dummy patterns DM can be formed so that the structures of the first pixel PA, second pixel PB, third pixel PC, and fourth pixel PD become closer to similar shapes. Alternatively, the dummy patterns DM can be formed so that a structure mirror-symmetrical to one of the first pixel PA, second pixel PB, third pixel PC, and fourth pixel PD and the structures of other pixels become closer to similar shapes. As in the first embodiment, letting d be the radius of the light waveguide LWG, the dummy pattern 23 is preferably a pattern including a portion arranged in a virtual column that has a radius of (4/3)d and is concentric with the light waveguide LWG.

Figure 13:
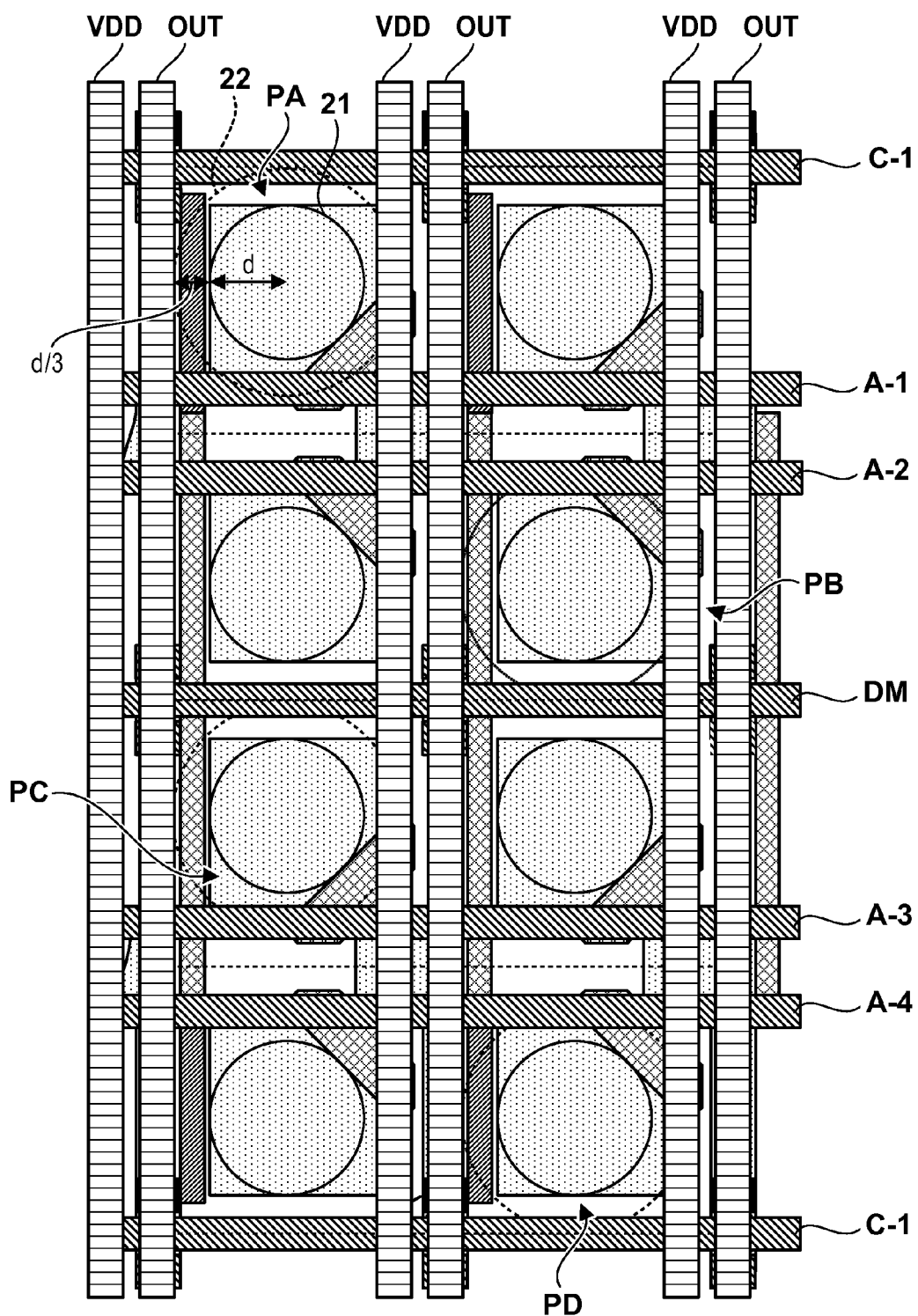
FIG. 13 is a view showing the layout of a solid-state image sensor including the pixel unit shown in FIG. 9.

FIG. 13 shows an example of the layout design of a solid-state image sensor including the pixel unit shown in FIG. 9. This layout design example shown in FIG. 13 can be adopted together with the layout design example shown in FIG. 11 and/or the layout design example shown in FIG. 12, and can also be adopted singly. A power supply line VDD and output signal line OUT are patterns formed in a wiring layer 9 (see FIG. 3). The wiring layer 9 is a second metal wiring layer. A solid line 21 indicates a light waveguide in a section (C-C' in FIG. 3) cut parallel to the wiring layer 9 and at the same height as that of the wiring layer 9. A dotted line 22 indicates a light leak range assumed in the first pixel PA and second pixel PB. This range is calculated by equation (3).

In the first and second embodiments as described above, the dummy patterns are formed so that the structures of a plurality of pixels become closer to similar shapes, or a structure mirror-symmetrical to one of the plurality of pixels and the structures of other pixels become closer to similar shapes. This makes it possible to reduce the sensitivity difference between the pixels.

The first and second embodiments have been explained for a green (G) pixel in order to simplify the explanation, but the present invention is applicable to a pixel to which a color filter of another color is allocated. Typically, the sensitivity difference is reduced between pixels to which color filters of the same color are allocated. In a monochromatic sensor and three-device color sensor, dummy patterns can be arranged so as to reduce the sensitivity difference between all pixels in one sensor chip.

The shape of the section (parallel to the surface of a semiconductor substrate) of the waveguide need not be a circle. In other words, the waveguide may have another columnar shape such as a polygonal column, instead of a circular column. That is, letting d be the width of the light waveguide, the dummy pattern can be configured to include a portion arranged in a virtual columnar shape having a width of (4/3)d and concentric with the light waveguide.

The structural portion ST may also have three or more wiring layers, in addition to the gate electrode layer.

The first and second embodiments have been described about the case in which the radius d of the light waveguide remains the same at all heights. However, in a structure in which a taper angle is given to a light waveguide, incident light can totally be reflected by the sidewall of the waveguide and can efficiently be concentrated to a light-receiving portion. Although the radius of the waveguide changes in accordance with the height of each wiring layer in this structure, the present invention need only be applied to each wiring layer.

The material of the gate electrode layer is not particularly limited. However, the effect of the present invention is more notably obtained when the gate electrode layer is made of polysilicon. This is so because polysilicon is a material having a refractive index higher than those of metal materials, so light easily leaks from inside a light waveguide. In addition, polysilicon bends the leakage light in a direction away from a photodiode, and this exerts a large influence on the sensitivity.

As an application example of the solid-state image sensor according to each embodiment described above, a camera incorporating the solid-state image sensor will be explained below. The concept of a camera includes not only an apparatus whose main purpose is image sensing, but also an apparatus (for example, a personal computer or portable terminal) having an image sensing function as an auxiliary function. The camera includes the solid-state image sensor according to the present invention explained in the above-mentioned embodiment, and a processing unit for processing an output signal from the solid-state image sensor. This processing unit can include an A/D converter, and a processor for processing digital data output from the A/D converter.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2011-231093, filed Oct. 20, 2011, which is hereby incorporated by reference herein in its entirety.

What is claimed is:

1. A solid-state image sensor comprising a plurality of pixel units, wherein
   each pixel unit comprises a plurality of pixels, and a charge-voltage converter shared by the plurality of pixels, each pixel including a photoelectric converter formed in a semiconductor substrate,
   the sensor comprises, on the semiconductor substrate, a structural portion including a plurality of wiring layers, an interlayer insulating film, and light waveguides configured by embedding, in portions of the interlayer insulating film which are located above the photoelectric converters, a material having a refractive index higher than that of the interlayer insulating film,
   the plurality of pixels in each pixel unit include a first pixel and a second pixel, and
   a dummy pattern is formed in the structural portion to reduce a difference between a sensitivity of the first pixel and a sensitivity of the second pixel, which is produced by a difference between a structure in a periphery of the light waveguide arranged above the photoelectric converter of the first pixel and a structure in a periphery of the light waveguide arranged above the photoelectric converter of the second pixel, wherein the dummy pattern is arranged between the light waveguides adjacent to each other.

2. The sensor according to claim 1, wherein the dummy pattern is given a fixed potential or floats and is made of polysilicon.

3. The sensor according to claim 1, further comprising color filters of a plurality of colors,
wherein the first pixel and the second pixel are pixels to which color filters of the same color are allocated.

4. The sensor according to claim 1, wherein letting d be a width of the light waveguide, the dummy pattern includes a portion arranged in a virtual columnar shape having a width of (4/3)d and is concentric with the light waveguide.

5. A solid-state image sensor comprising:
a plurality of pixel units including a first pixel unit and a second pixel unit, wherein the first pixel unit comprises a plurality of pixels including a first pixel, and a first charge-voltage converter shared by the first pixel and another pixel of the first pixel unit, the first pixel including a first photoelectric converter formed in a semiconductor substrate, and the second pixel unit comprises a plurality of pixels including a second pixel, and a second charge-voltage converter shared by the second pixel and another pixel of the second pixel unit, the second pixel including a second photoelectric converter formed in the semiconductor substrate;
a plurality of wiring layers arranged on the semiconductor substrate;
an interlayer insulating film disposed between the plurality of wiring layers;
a plurality of light waveguides including a first light waveguide and a second light waveguide, the first light waveguide being located above the first photoelectric converter, the second light waveguide being located above the second photoelectric converter, a material of the first and second light waveguides having a refractive index higher than that of the interlayer insulating film; and
a color filter array in which color filters of the same color are allocated to the first and second pixels,
wherein one wiring layer of the plurality of wiring layers includes a first pattern and a second pattern, the first pattern being a dummy pattern and being arranged between the first light waveguide and a waveguide adjacent to the first light waveguide, and the second pattern being arranged between the second light waveguide and a waveguide adjacent to the second light waveguide, and
wherein, letting d be a width of the first and second light waveguides, the first pattern has a portion arranged in a first virtual columnar shape which has a width of (4/3)d and is concentric with the first light waveguide, and the second pattern has a portion arranged in a second virtual columnar shape which has a width of (4/3)d and is concentric with the second light waveguide.

6. The sensor according to claim 5, wherein the first pattern is given a fixed potential or floats.

7. The sensor according to claim 5, wherein the first pixel and the second pixel have more similar shapes than in a case where the first pattern does not exist.

8. The sensor according to claim 5, wherein the first and second patterns are made of polysilicon.

9. The sensor according to claim 5, wherein the first pattern is separated from a gate electrode of a transistor and the second pattern is a gate electrode of a transistor.

10. The sensor according to claim 5, wherein the first pattern extends from a gate electrode of a transistor.

11. The sensor according to claim 5, wherein the first and second patterns are made of a metal.

12. A solid-state image sensor comprising:
a pixel unit comprising a plurality of pixels including a first pixel and a second pixel, and a charge-voltage converter shared by the first pixel and the second pixel, the first pixel including a first photoelectric converter formed in a semiconductor substrate, the second pixel including a second photoelectric converter formed in the semiconductor substrate;
a plurality of wiring layers arranged on the semiconductor substrate;
an interlayer insulating film disposed between the plurality of wiring layers;
a plurality of light waveguides including a first light waveguide and a second light waveguide, the first light waveguide being located above the first photoelectric converter, the second light waveguide being located above the second photoelectric converter, a material of the first and second light waveguides having a refractive index higher than that of the interlayer insulating film; and
a color filter array in which color filters of the same color are allocated to the first and second pixels,
wherein one wiring layer of the plurality of wiring layers includes a first pattern and a second pattern, the first pattern being a dummy pattern and being arranged between the first light waveguide and a waveguide adjacent to the first light waveguide, and the second pattern being arranged between the second light waveguide and a waveguide adjacent to the second light waveguide, and
wherein, letting d be a width of the first and second light waveguides, the first pattern has a portion arranged in a first virtual columnar shape which has a width of (4/3)d and is concentric with the first light waveguide, and the second pattern has a portion arranged in a second virtual columnar shape which has a width of (4/3)d and is concentric with the second light waveguide.

13. The sensor according to claim 12, wherein the first pattern is given a fixed potential or floats.

14. The sensor according to claim 12, wherein the first pixel and the second pixel have more similar shapes than in a case where the first pattern does not exist.

15. The sensor according to claim 12, wherein the first and second patterns are made of polysilicon.

16. The sensor according to claim 12, wherein the first pattern is separated from a gate electrode of a transistor and the second pattern is a gate electrode of a transistor.

17. The sensor according to claim 12, wherein the first pattern extends from a gate electrode of a transistor.

18. The sensor according to claim 12, wherein the first and second patterns are made of a metal.

19. A camera comprising:
a solid-state image sensor cited in claim 5; and
a processor configured to process an output signal from the solid-state image sensor.

20. A camera comprising:
a solid-state image sensor cited in claim 12; and
a processor configured to process an output signal from the solid-state image sensor.

* * * * *